US008618573B2

(12) United States Patent
Sugiura et al.

(10) Patent No.: US 8,618,573 B2
(45) Date of Patent: Dec. 31, 2013

(54) LAYERED SUBSTRATE, LIGHT-EMITTING DIODE INCLUDING THE LAYERED SUBSTRATE AND LIGHTING DEVICE USING THE LIGHT-EMITTING DIODE

(75) Inventors: Miharu Sugiura, Fujikawaguchiko-machi (JP); Junji Miyashita, Fujiyoshida-shi (JP)

(73) Assignees: Citizen Electronics Co., Ltd., Yamanashi-Ken (JP); Citizen Holdings Co., Ltd., Tokyo (JP)

( * ) Notice: Subject to any disclaimer, the term of this patent is extended or adjusted under 35 U.S.C. 154(b) by 0 days.

(21) Appl. No.: 13/584,446

(22) Filed: Aug. 13, 2012

(65) Prior Publication Data

US 2013/0037847 A1 Feb. 14, 2013

(30) Foreign Application Priority Data

Aug. 11, 2011 (JP) ................................. 2011-175955

(51) Int. Cl.
*H01L 33/64* (2010.01)
*H01L 23/04* (2006.01)
*H05K 7/04* (2006.01)

(52) U.S. Cl.
USPC 257/99; 257/730; 257/E33.075; 257/E23.104

(58) Field of Classification Search
None
See application file for complete search history.

(56) References Cited

U.S. PATENT DOCUMENTS

| 7,888,852 | B1 * | 2/2011 | Sung ............................... 313/46 |
| 2011/0001162 | A1 * | 1/2011 | Nakayama et al. ............. 257/99 |
| 2011/0111537 | A1 * | 5/2011 | Cheng et al. .................... 438/26 |
| 2011/0175119 | A1 * | 7/2011 | Kim et al. ........................ 257/91 |

FOREIGN PATENT DOCUMENTS

| EP | 2175498 A2 * | 4/2010 | ............. H01L 33/48 |
| JP | 200012773 A | 1/2000 | |
| JP | 2010067902 A * | 3/2010 | ............. H01I 33/48 |
| JP | 201191344 A | 5/2011 | |
| JP | 2011091344 A * | 5/2011 | ............. H01I 33/48 |
| JP | 2012164774 A * | 8/2012 | ............. H01I 33/48 |

OTHER PUBLICATIONS

Machine translation of JP 2011091344.*

* cited by examiner

*Primary Examiner* — Thomas L Dickey
*Assistant Examiner* — Joseph Schoenholtz
(74) *Attorney, Agent, or Firm* — Browdy and Neimark, PLLC

(57) ABSTRACT

A layered substrate includes a first substrate including an upper surface, a lower surface, a peripheral surface between peripheral edges of the upper surface and the lower surface, and a cut portion cut into the peripheral surface and passing through the upper surface and the lower surface, and a second substrate including an upper surface, a lower surface, and a peripheral surface between peripheral edges of the upper surface and the lower surface, and the lower surface of the second substrate layered on the upper surface of the first substrate and closing the cut portion of the first substrate from above. The second substrate includes a heat conductor that is thermally connected to an element to be mounted on the upper surface of the second substrate, the heat conductor configured to thermally extend to the cut portion of the first substrate.

19 Claims, 12 Drawing Sheets

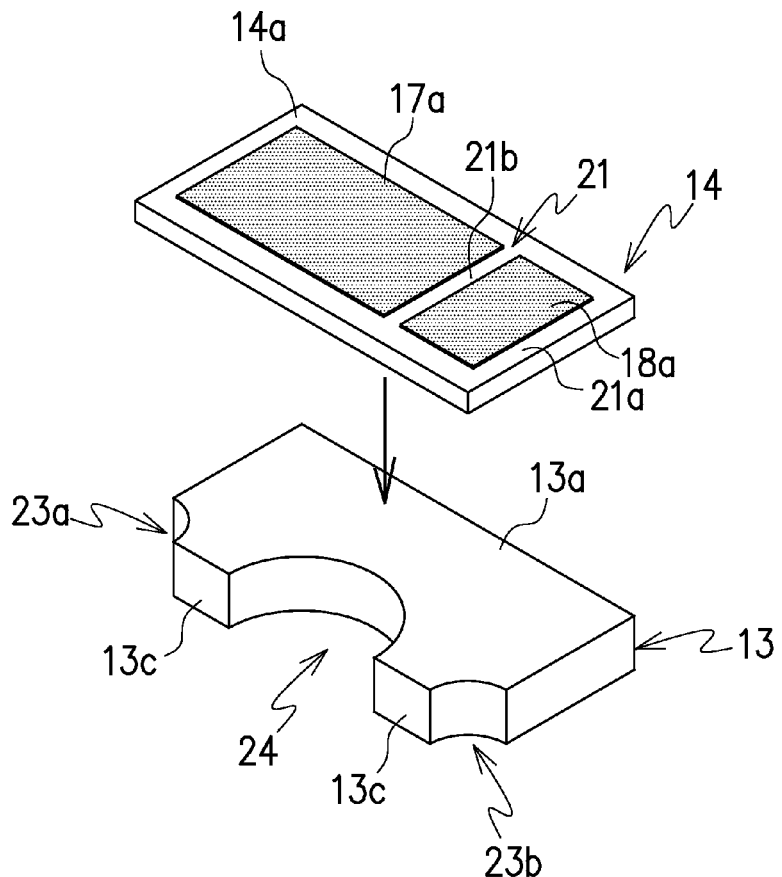
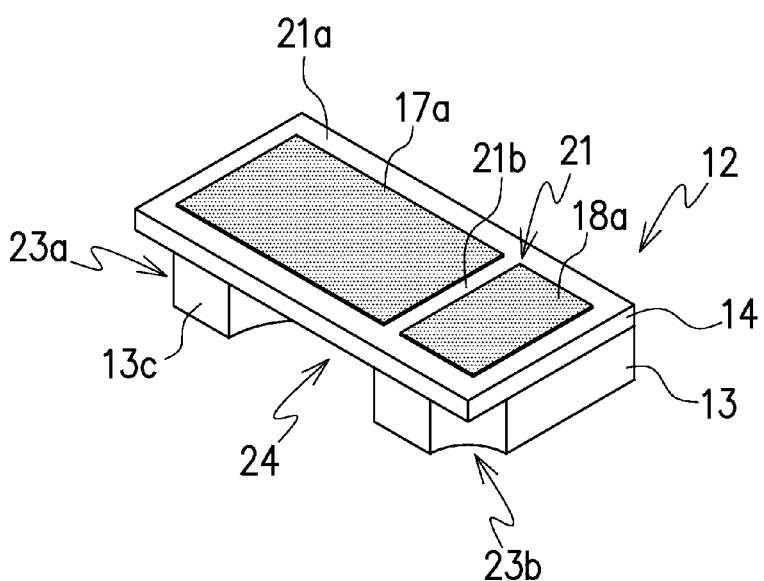

LAYERED SUBSTRATE, LIGHT-EMITTING DIODE INCLUDING THE LAYERED SUBSTRATE AND LIGHTING DEVICE USING THE LIGHT-EMITTING DIODE

CROSS REFERENCE TO RELATED APPLICATION

This application is based on and claims the priority benefit of Japanese Patent Application No. 2011-175955, filed on Aug. 11, 2011, the disclosure of which is incorporated herein by reference in its entirety.

BACKGROUND OF THE INVENTION

1. Field of the Invention

The present invention relates to a layered substrate, to a light-emitting diode (hereinafter, referred to as LED) including the layered substrate, and to an electric or electronic device including a motherboard, on which a part of peripheral side surface of the layered substrate of the LED is mounted.

2. Description of the Related Art

As a light source, an LED to be mounted on a motherboard, a side surface of the LED to be mounted on the motherboard is conventionally known, for example, in JP2011-91344A and JP2000-12773. JP2011-91344A discloses and LED that includes a frame 10 with a T-shape portion at a side surface that is to be mounted on a motherboard, and JP2000-12773 discloses a layered substrate with a plurality of terminal electrodes provided at a side surface of the layered substrate.

SUMMARY OF THE INVENTION

The present invention is proposed in view of such conventional devices as above-described.

According to embodiments of the present invention, a layered substrate including a first substrate that includes an upper surface, a lower surface, a peripheral surface between peripheral edges of the upper surface and the lower surface, and a cut portion cut into the peripheral surface and passing through the upper surface and the lower surface, a second substrate including an upper surface, a lower surface, and a peripheral surface between peripheral edges of the upper surface and the lower surface, and the lower surface of the second substrate layered on the upper surface of the first substrate and closing the cut portion of the first substrate from above, and the second substrate including a heat conductor that is thermally connected to an element to be mounted on the upper surface of the second substrate, the heat conductor configured to thermally extend to the cut portion of the first substrate.

The heat conductor may be a metal filled in a hole provided in the second substrate, or maybe a metal plate disposed on the first substrate to cover the cut portion of the first substrate from above. Also, the heat conductor may be at least one strip of thermally conductive sheet that covers the cut portion from above.

Furthermore, in embodiments, a light-emitting diode includes a layered substrate according to the embodiments of the present invention, the element that is a light-emitting element mounted on the upper surface of the second substrate, and such a light-emitting diode may be mounted on a motherboard of an electric or electronic device to be a light source in such a device.

BRIEF DESCRIPTION OF THE DRAWINGS

FIG. 3A is an exploded perspective view as viewed from above, of a layered substrate according to the first embodiment of the present invention, and in the layered substrate, a second substrate is to be mounted on an upper surface of a first substrate, as viewed from above the second substrate.

FIG. 3B is a perspective view of a layered substrate according to a first embodiment of the present invention, showing the second substrate is to be mounted on the upper surface of the first substrate.

DETAILED DESCRIPTION OF THE PREFERRED EMBODIMENTS

Figure 1:
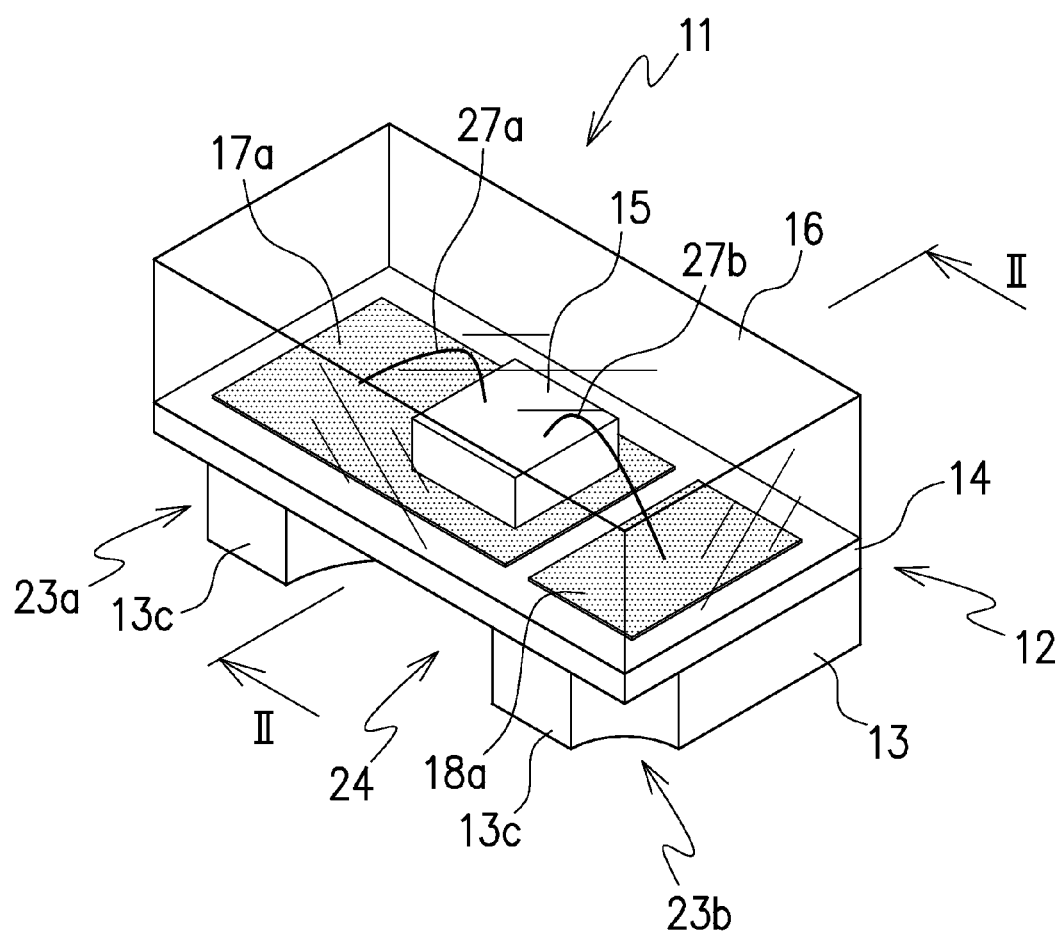
FIG. 1 is a perspective view of an LED including a layered substrate according to a first embodiment of the present invention.

The following detailed description refers to the accompanying drawings, which illustrate specific embodiments of the invention. Other embodiments including different structures and operation do not depart from the scope of the present invention.

Embodiments of the invention are described with reference to drawings included herewith. Like reference numbers refer to like structures throughout. It should be noted that the drawings are schematic in nature. Not all parts are always shown to scale.

A layered substrate 12 according to embodiments of the invention includes a first substrate 13 that includes an upper surface 13a, a lower surface 13b, a peripheral surface including, for example, a side surface 13c between peripheral edges of the upper surface 13a and the lower surface 13b, and a first cut portion 24 cut into the peripheral surface 13c and passing through the upper surface 13a and the lower surface 13b, and a second substrate 14 that includes an upper surface 14a, a lower surface 14b, and a peripheral surface 14c between peripheral edges of the upper surface 14a and the lower surface 14b, and the lower surface 14b of the second substrate 14 disposed on the upper surface 13a of the first substrate 13 and closing the cut portion 24 of the first substrate 13 from above. An element 15 is to be mounted on the upper surface 14a of the second substrate 14. The second substrate 14 may include a heat conductor 19a (19b) that is configured to thermally extend to the cut portion 24 of the first substrate 13. The element 15 is explained as a light-emitting element in following embodiments of the present invention, however, embodiments of the layered substrate according to the present invention is not limited to the use with a light-emitting element. If an element or a part generates heat, the layered substrate shown in embodiments of the present invention can be used with such an element or a part for heat release.

Embodiments of a layered substrate and an LED including and/or a lighting device including such a layered substrate according to embodiments of the present invention are explained hereinafter in detail with reference to the accompanying drawings.

Figure 2:
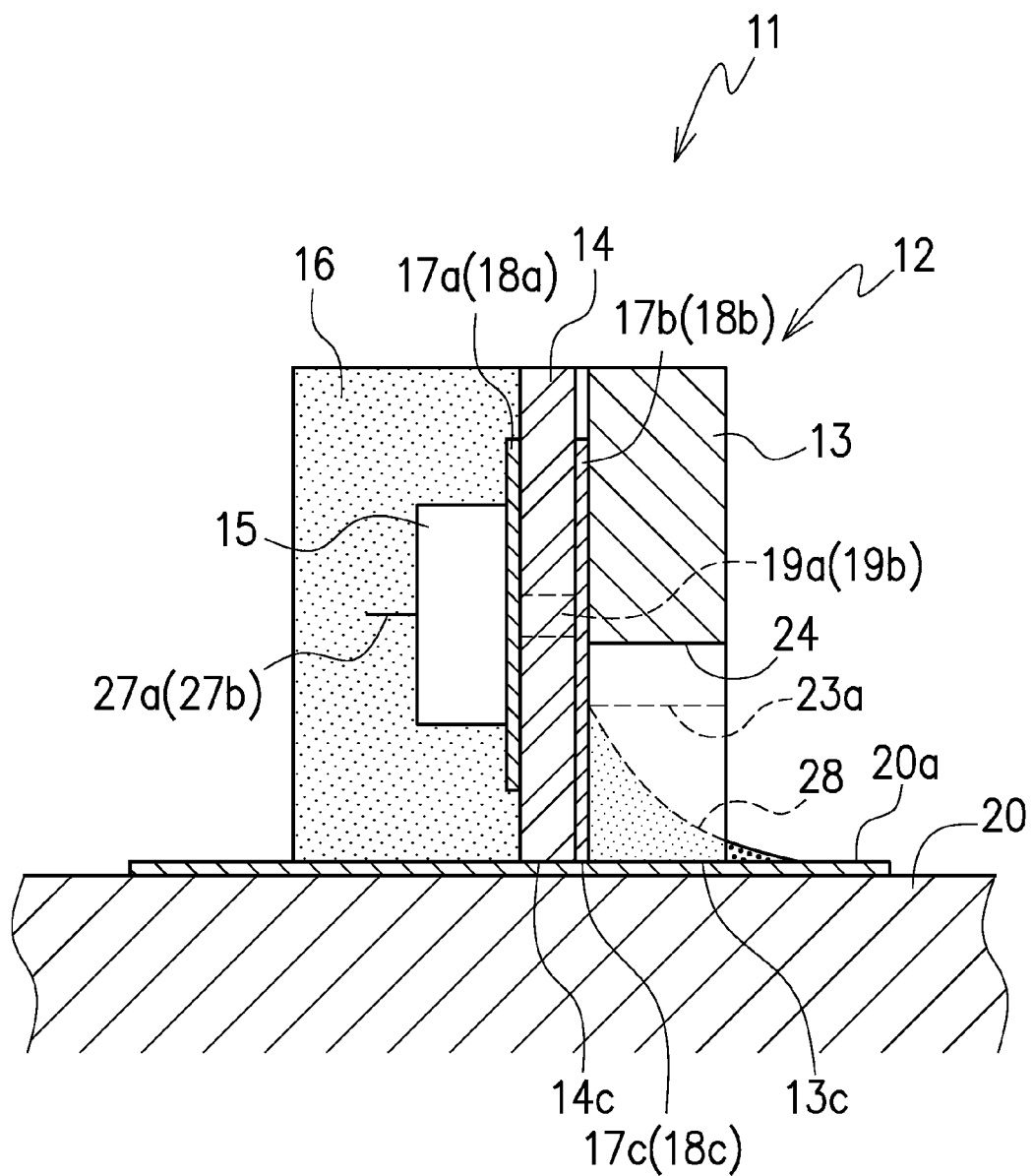
FIG. 2 is a sectional view taken along line II-II of the LED shown in FIG. 1 which is mounted on a motherboard.

FIG. 1 shows a perspective view of an LED including a layered substrate according to a first embodiment of the present invention, and FIG. 2 shows a sectional view of the LED taken along line II-II of the LED, which is mounted on a motherboard of an electric or electronic device. FIGS. 3A to 5 shows a layered substrate according to a first embodiment of the present invention.

As shown in FIG. 1, the LED 11 includes the layered substrate 12 and an element 15 mounted on the upper surface 14a of the second substrate 14. The element 15 here is a light-emitting element such as an LED element. For more details, the LED 11 includes a first substrate 13 that includes an upper surface 13a, a lower surface 13b, a peripheral surface 13c between peripheral edges of the upper surface 13a and the lower surface 13b, and a cut portion 24 cut into the peripheral surface 13c and passing through the upper surface 13a and the lower surface 13b, and a second substrate 14 that includes an upper surface 14a, a lower surface 14b, and a peripheral surface 14c between peripheral edges of the upper surface 14a and the lower surface 14b, and the lower surface 14b of the second substrate 14 layered on the upper surface 13a of the first substrate 13 and closing the cut portion 24 of the first substrate 13 from above, and a light-emitting element 15 mounted on the upper surface 14a of the second substrate 14. Also, the second substrate 14 of the layered substrate includes at least one heat conductor 19a or/and 19b that is/are thermally connected to the light-emitting element 15 mounted on the upper surface 14a of the second substrate 14, and the heat conductor 19a or 19b configured to thermally extend to the cut portion 24 of the first substrate 13 (see FIG. 5).

The heat conductor 19a or/and 19b is/are provided in the second substrate 14 and passes/pass through the second substrate 14 from the upper surface 14a to the lower surface 14b of the second substrate 14. The case that both the heat conductors 19 and 19b are employed as first and second heat conductors are described hereinafter.

The second substrate 14 includes an upper electrode provided on the upper surface 14a of the second substrate 14 and a lower electrode provided on the lower surface 14b of the second substrate 14. For more details, the first heat conductor 19a thermally connects a first upper electrode 17a and a first lower electrode 17b and the second heat conductor 19b thermally connects the second upper electrode 18a and the second lower electrode 18b of the second substrate 14. In this embodiment, the element 15 is to be mounted on the first upper electrode 17a that is thermally connected to the first lower electrode 14b through the first heat conductor 19a. As the first lower electrode 14b provided on the lower surface 14b of the second substrate 14 includes an overlapped portion with the cut portion 24 of the first substrate 13 as viewed from top plan, the first heat conductor 19a thermally extends to the cut portion 24 of the first substrate 13 through the first lower electrode 14b. That is to say, at least a part of the lower electrode is exposed from the cut portion 24 of the first substrate 13, as viewed from below the first substrate 13, and therefore, heat generated from the element 15 that is mounted to be on the first upper electrode 17a disposed on the second substrate 14 can be efficiently released to the outside.

In the first embodiment, the second substrate 14 is formed by a resin plate made of a resin such as epoxy resin, BT resin or the like, and the second substrate 14 is rectangular in shape.

The second substrate 14 includes a pair of upper electrodes as a first upper electrode 17a and a second upper electrode 18a with a space or a gap 21 between the first upper electrode 17a and the second upper electrode 18a on the upper surface 14a of the second substrate 14, a pair of lower electrodes as a first lower electrode 17b and a second lower electrode 18b with a space or a gap 22 between the first lower electrode 17b and the second lower electrode 18b on the lower surface 14b of the second substrate 14, and the heat conductor that includes a pair of heat conductors as a first heat conductor 19a and a second heat conductor 19b. The first upper electrode 17a is electrically connected to the first lower electrode 17b through the first heat conductor 19a, and the second upper electrode 18a is electrically connected to the second lower electrode 18b through the second heat conductor 19b. The first upper electrode 17a, the second upper electrodes 18a, the first lower electrode 17b and the second lower electrode 18b are made of a thermally conductive material, for example, aluminum, copper or the like, which are also electrically conductive.

As the spaces or gaps 21 and 22 are portions where an electrode is not provided, the space 21 between the first upper electrode 17a and the second upper electrode 18a electrically separates the first upper electrode 17a and the second upper electrode 18a, and the space 22 between the first lower electrode 17b and the second lower electrode 18b electrically separates the first lower electrode 17b and the second lower electrode 18b.

Figure 4A:
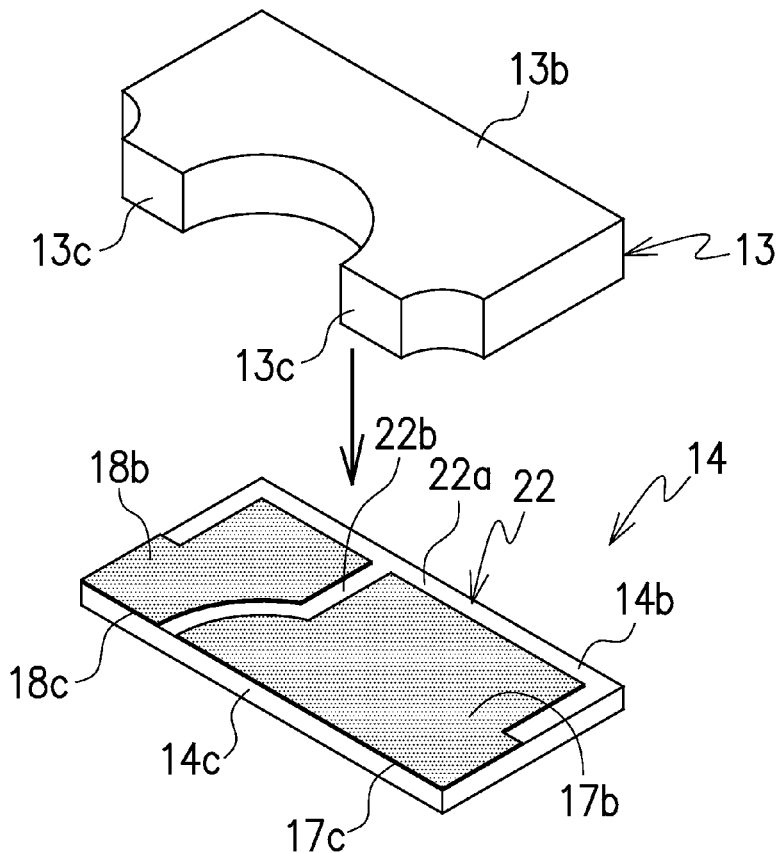
FIG. 4A is an exploded perspective view of the layered substrate in which the second substrate is to be mounted on the upper surface of the first substrate, as viewed from below the first substrate.
Figure 4B:
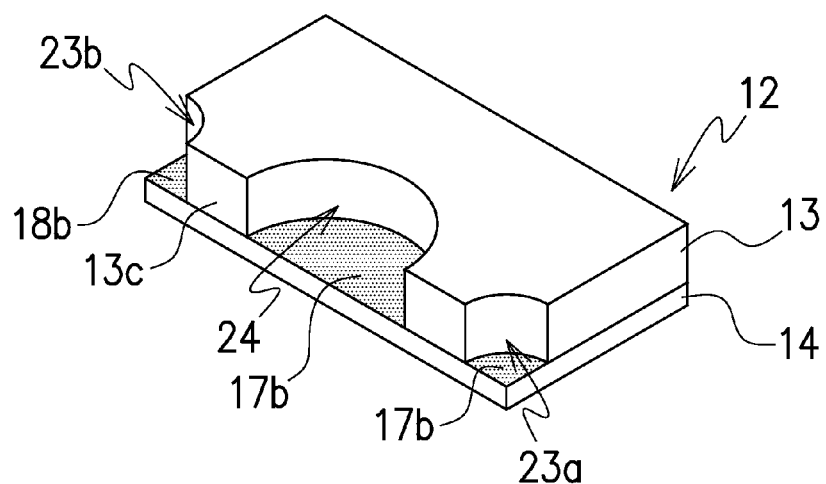
FIG. 4B is a perspective view of the layered substrate of the first embodiment in which the second substrate is mounted on the upper surface of the first substrate.
Figure 5:
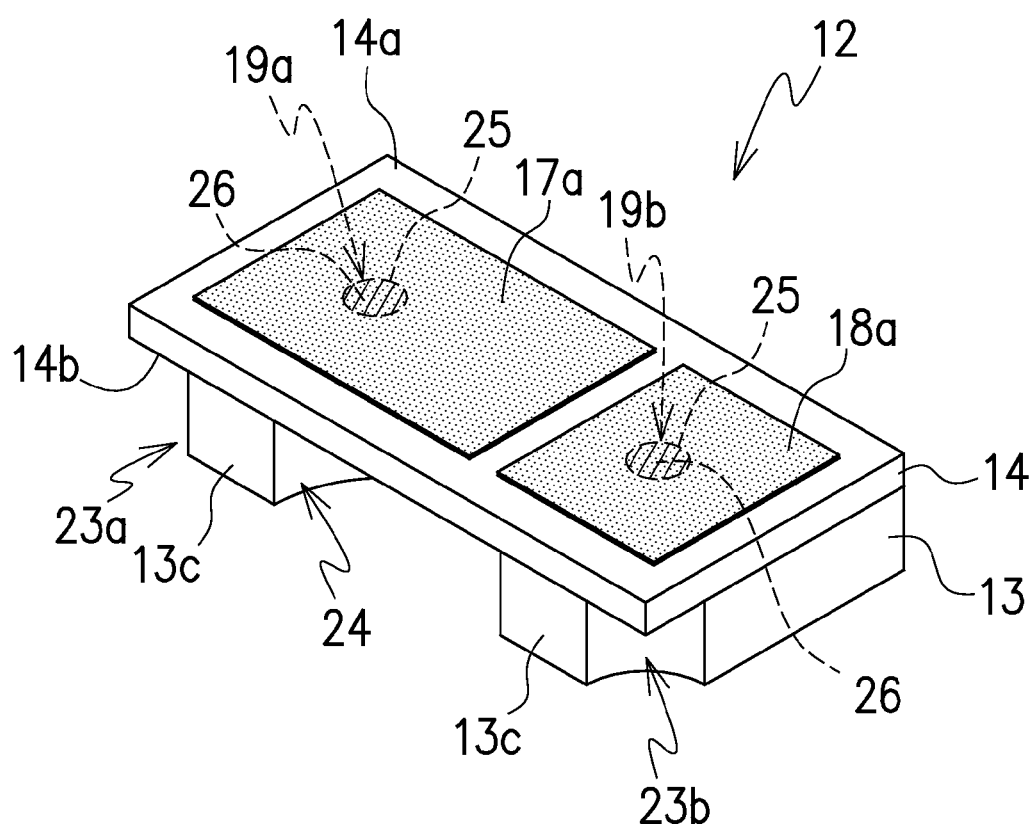
FIG. 5 is a perspective view showing positions of a first heat conductor and a second heat conductor which are provided in the second substrate of the layered substrate.

The upper space provided on the upper surface 14a of the second substrate 14 includes an upper outer peripheral portion 21a which extends in a shape of rectangular frame along an outer peripheral edge of the upper surface 14a of the second substrate 14 and a line portion 21b provided in a shape of line between the first upper electrode 17a and the second upper electrode 18a and electrically separating the first upper electrode 17a and the second upper electrode 18a. In the first embodiment, because the light-emitting element 15 is mounted on the first upper electrode 17a, as described hereinafter, the first upper electrode 17a is larger than the second upper electrode 18a in area. The lower space provided on the lower surface 14b of the second substrate 14 includes a lower outer peripheral portion 22a which extends in a shape of half-rectangular frame along an outer peripheral edge of the lower surface 14b of the second substrate 14 and a line portion 22b provided in a shape of line between the first lower electrode 17b and the second lower electrode 18b and electrically separating the first lower electrode 17b and the second lower electrode 18b, as shown in FIGS. 4A and 4B. The lower outer peripheral portion 22a is positioned in a shape of semi-rectangular frame and disposed at another side opposite to the one side where the cut portion 24 of the first substrate 13 is provided. Also, the first substrate 13 may include the cut portion 24 as a first cut portion 24 at one side of the first substrate 13 and a second cut portion 23a and a third cut portion 23b provided at opposite ends of the one side of the first substrate 13. In other words, the second cut portion 23a and the third cut portion 23b are provided at corners of the first substrate 13 with the first cut portion 24 centered between the second cut portion 23a and the third cut portion 23b. The second cut portion 23a and the third cut portion 23b are smaller than the first cut portion 24 in size, but when the second substrate 14 is layered on the first substrate 13, the first lower electrode 17b provided on the lower surface 14b of the second substrate 14 overlaps the first cut portion 24 and the second cut portion 23a, and the second lower electrode 18b provided on the lower surface 14b of the second substrate 14 overlaps the third cut portion 23b of the first substrate 13 in a top or bottom plan view. The first substrate 13 may be greater than the second substrate 14, in thickness, and in this case, when the layered substrate 14 is mounted on a motherboard of an electric or electronic device, it is possible to dispose a sufficient solder for electrical connection to the mother board in the second cut portion 23a and the third cut portion 23b and the solder also works for thermal release from the element.

If the light-emitting element 15 mounted on the upper surface 14a of the second substrate 14, the light-emitting element 15 may be sealed by a light-transmitting resin 16. In addition, the light-transmitting resin 16 may include a phosphor to convert a part of light emitted from the light-emitting element 15.

FIG. 3A is an exploded perspective view of the layered substrate 12 according to the first embodiment of the present invention, and in the layered substrate 12, a second substrate 14 is to be mounted on an upper surface 13a of the first substrate 13, and FIG. 3B is a perspective view of the layered substrate 12 after the second substrate 14 is mounted on the upper surface 13a of the first substrate 13.

In the first embodiment, the cut portion 24 is provided in a central portion of the one side surface 13c of the first substrate 13 and cut portions are provided in opposite corners of the one side surface 13c (see FIG. 3A). The cut portion 24 and the cut portions 23a and 23b are cut in the one side surface and pass through the first substrate 13 upward and downward. As mentioned above, the cut portion 24 is referred to as first cut portion, and the cut portion 23a second cut portion and the cut portion 23b third cut portion. The second substrate 14 is disposed on the upper surface 13a of the first substrate 13 to close the first cut portion 24 of the first substrate 13.

In the first embodiment, peripheral side surfaces of the first substrate 13 and the second substrate 14 are flush with each other except the first cut portion 24, the second cut portion 23a and the third cut portion 23b of the first substrate 13. Consequently, in the first embodiment, the lower surface 14a with the first lower electrode 17b and the second lower electrode 18b of the second substrate 14 is disposed on the upper surface 13a of the first substrate 13 to close the first cut portion 24, the second cut portion 23a and the third cut portion 23b of the first substrate 13 from above.

FIG. 4A is an exploded perspective view of the layered substrate 12 in which the second substrate 14 is to be mounted on the upper surface 13a of the first substrate 13, as viewed from below the first substrate 13, and FIG. 4B is a perspective view of the layered substrate 12 of the first embodiment in which the second substrate 14 is mounted on the upper surface 13a of the first substrate 13.

Each of the first heat conductor 19a and the second heat conductor 19b includes a pass-through hole 25 passing through the second substrate 14 from the upper surface 14a to the lower surface 14b of the second substrate 14, and a metallic material 26 filled in the pass-through hole 25. As the metallic material 26, aluminum, copper or the like having high heat conductivity, similar to the material of the first upper electrodes 17a, 18a and the second lower electrodes 17b, 18b is preferably used.

As shown in FIG. 1, the light-emitting element 15 is directly mounted on the first upper electrode 17a disposed on the upper surface 14a of the second substrate 14. The light-emitting element 15 includes a first element electrode and a second element electrode. If the first and second element electrodes of the light-emitting element 15 are positioned at an upper surface of the light-emitting element 15, the first element electrode of the light-emitting element 15 is electrically connected to the first upper electrode 17a by a first metallic wire 27a and the second element electrode of the light-emitting element 15 is electrically connected to the second upper electrode 18a by a second metallic wire 27b. In the first embodiment, the light-emitting element 15, the first upper electrode 17a, the second upper electrode 18a and the first and second metallic wires 27a and 27b are sealed by a light-transmitting resin 16 attached to the second substrate 14.

Heat generated from the light-emitting element 15 is transmitted to the first upper electrode 17a because the light-emitting element 15 is directly in contact with the first upper electrode 17, and also transmitted to the first upper electrode 17a through the first metallic wire 27a and to the second upper electrode 18a through the second metallic wire 27b. If the first heat conductor 19a that is connected to the first upper electrode 17a is greater than the second heat conductor 19b in volume, heat generated from the light-emitting element 15 can be efficiently transmitted to the first lower electrode 17b.

When comparing a thickness of each of the first and second substrates in a direction from the upper surface to the lower surface, the first substrate 13 preferably has a thickness larger than that of the second substrate 14. This is because, when mounting the LED 11 on a motherboard 20 used for an illumination device and so on in a side mount manner and placing the one side surface 13c of the first substrate 13 having the cut portions on the motherboard to electrically connect the first and second lower electrodes which are disposed on the lower surface of the second substrate 14 and exposed from the cut portions, if the first substrate 13 has a large thickness, the first substrate itself can stand on the motherboard 20.

As mentioned above, the second cut portion 23a and the third cut portion 23b each having a generally ¼ circle-like shape are provided in the opposite corners of the one side surface 13c of long sides of the first substrate 13, and the first cut portion 24 of a generally semi-circular shape is provided in the central portion of the one side surface 13c of the first substrate 13 (see FIGS. 3A, 3B, 4A and 4B). The first cut portion 24 has a larger area than that of the second cut portion 23a and the third cut portion 23b. At each of the second cut portion 23a and the third cut portion 23b functions, solder tends to be accumulated when the first substrate 13 of the layered substrate 12 is mounted on a motherboard 20 used in an electric or electronic device such as an illumination device by placing the one side surface 13c of the first substrate 13 on the motherboard 20, and through the first cut portion 24 of the first substrate 13, heat generated from the light-emitting element 15 can be released efficiently. A size or shape of each of the first to third cut portions 24, 23a and 23b is not limited to one described in the specification or drawings. However, it is possible to improve heat release property from the lower electrodes 17b and 18b of the second substrate 14 exposed from the cut portions by increasing a size of each of the first to third cut portions 24, 23a and 23b as much as possible.

Meanwhile, it is possible to dispose the upper surface 13a of the first substrate 13 on the lower surface 14b of the second substrate 14 through an adhesive and so on, in case of forming the layered substrate 12 by mounting the second substrate 14 on the upper surface 13a of the first substrate 13.

If the LED 11 formed as mentioned above is used in a light-emitting device, it is mounted on the motherboard 20 in a side mount state where the one side surface 13c of the first substrate 13 is placed to be directed downward, and a radiation surface of the light-emitting element 15 is directed laterally, as shown in FIG. 2. In case of this disposition, a direction of forward movement of light emitted from the radiation surface of the light-emitting element 15 is parallel to an upper surface of the motherboard 20. Because the first cut portion 24, the second cut portion 23a and the third cut portion 23b which are disposed on both sides of the first cut portion in the first substrate of the LED 11 are disposed adjacent to the upper surface of the motherboard 20, the first and second lower electrodes 17b and 18b exposed from the first cut portion 24, the first and second cut portions disposed on the both sides of the first cut portion 24 are electrically and thermally connected to a circuit pattern 20a provided on the motherboard 20, by applying a solder 28 to the first and second lower electrodes.

At this time, the part of the first lower electrode 17b provided on the lower surface 14b of the second substrate 14 is exposed from the first cut portion 24 of the first substrate 13. In addition, the first and second lower electrodes 17b and 18b are in contact with the upper surface of the motherboard 20 directly. Consequently, heat occurred in the light-emitting element 15 can be efficiently released from a plurality of places In this way, by layering the second substrate 14 on the first substrate 13, it is possible to utilize the first lower electrode 17b of the second substrate 14 on which the light-emitting element 15 is mounted, as a heat-release surface. Therefore, because efficient heat-release effect can be obtained even if any heat release member is not provided, it is possible to provide an LED having a short manufacturing man-hour, a low cost, and a downsizing.

In the first embodiment, as the first cut portion 24 for heat release is formed in a concave cut portion or semi-circular shape cutting from a peripheral side surface in top plan view, a cutting or hole-making work becomes easier than making holes that just pass through a substrate. The cut portion may be formed in a square or triangle shape so that a surface of the first substrate that contacts with the motherboard can be widely secured.

FIGS. 6 to 9 illustrate a layered substrate 32 according to a second embodiment of the present invention and an LED 13 including the layered substrate. The layered substrate 32 includes a first substrate 33 and a second substrate 34 that includes a metal plate as a heat conductor layered onto an upper surface 33a of the first substrate 33 and the metal plate is disposed to close a first cut portion 44 of the first substrate 33 from above, and a light-emitting element 35 mounted on metal plate of the second substrate 34.

Figure 6:
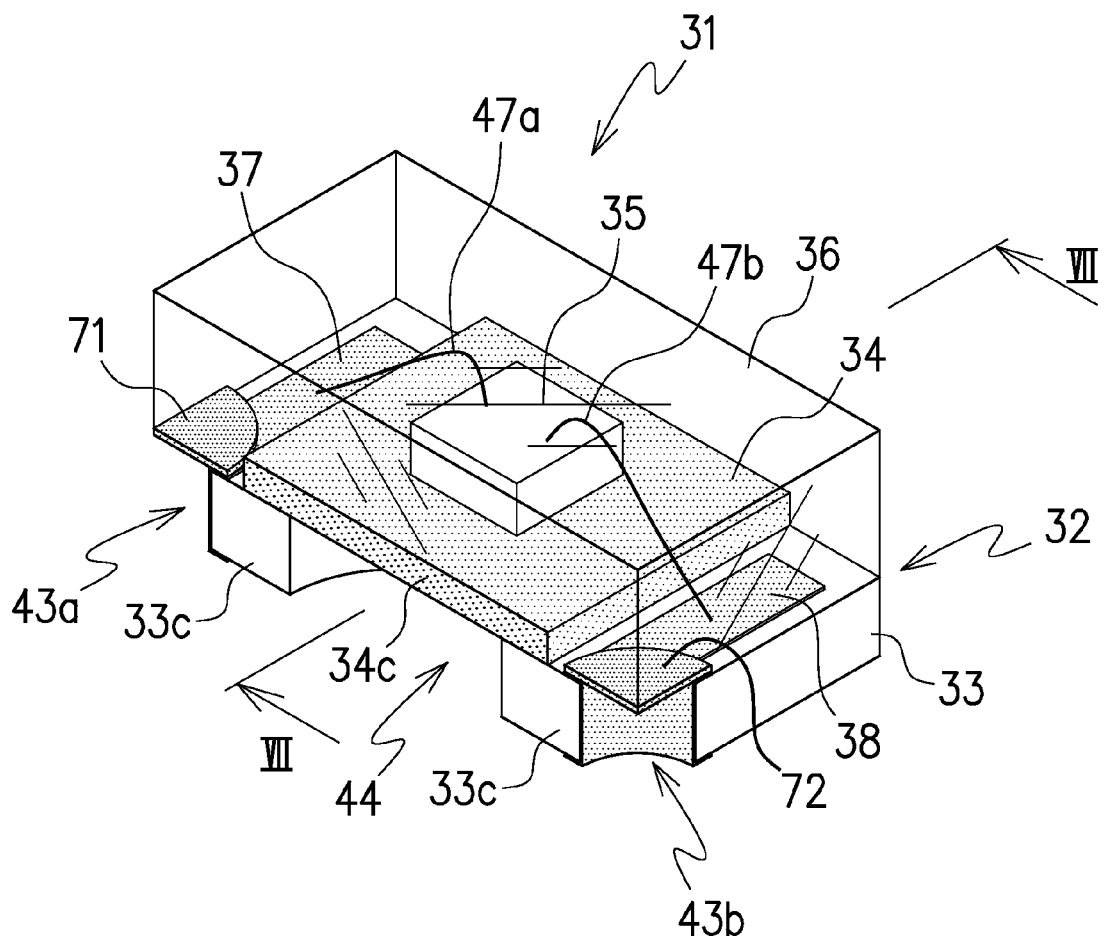
FIG. 6 is a perspective view of an LED including a layered substrate according to a second embodiment of the present invention and a light-emitting element mounted on the layered substrate.

As shown in FIG. 6, the first substrate 33 includes a first cut portion 44 provided in a central portion of one side surface 33c of the first substrate 33 and passing through upper and lower surfaces of the first substrate 33, and a second cut portion 43a and a third cut portion 43b as a pair of cut portions provided in opposite corners of the one side surface, similarly to the first embodiment. In addition, a first upper electrode 37 and a second upper electrode 38 as a pair of electrodes are provided on opposite sides of the upper surface 33a of the first substrate 33. The first upper electrode 37 is electrically connected to a lower surface 33b side of the first substrate 33 through a first through-hole electrode 49a provided in the second cut portion 43a of the first substrate 33, as shown in FIGS. 8A, 8B and 9A, 9B. The second upper electrode 38 is electrically connected to a lower surface 33b side of the first substrate 33 through a second through-hole electrode 49b provided in the third cut portion 43b of the first substrate 33, as shown in FIGS. 8A, 8B and 9A, 9B.

In the second embodiment, a first strip or covering plate 71, which is explained as a first strip hereafter as a matter of practical convenience, is provided on an upper end of the first through-hole electrode 49a to cover the second cut portion 43a, and a second strip or covering plate 72, which is explained as a second strip hereafter as a matter of practical convenience, is provided on an upper end of the second through-hole electrode 49b to cover the third cut portion 43b, the second cut portion 43a and the third cut portion 43b being provided on the corners of the first substrate 33. Each of the first through-hole electrode 49a and the second through-hole electrode 49b has a ¼ circle-like shape in this embodiment. The first strip 71 and the second strip 72 are formed by an electric-conductive material. The first strip 71 covering the second cut portion 43a is electrically connected to both the first upper electrode 37 and the first through-hole electrode 49a, and the second strip 72 covering the third cut portion 43b is electrically connected to both the second upper electrode 38 and the second through-hole electrode 49b. Accordingly, when placing a light-transmitting resin 36 on the upper surface 33a of the first substrate 33, the first strip 71 and the second strip 72 prevent a resin 36 from entering the second cut portion 43a and the third cut portion 43b, while securing an electrical connection.

Figure 7:
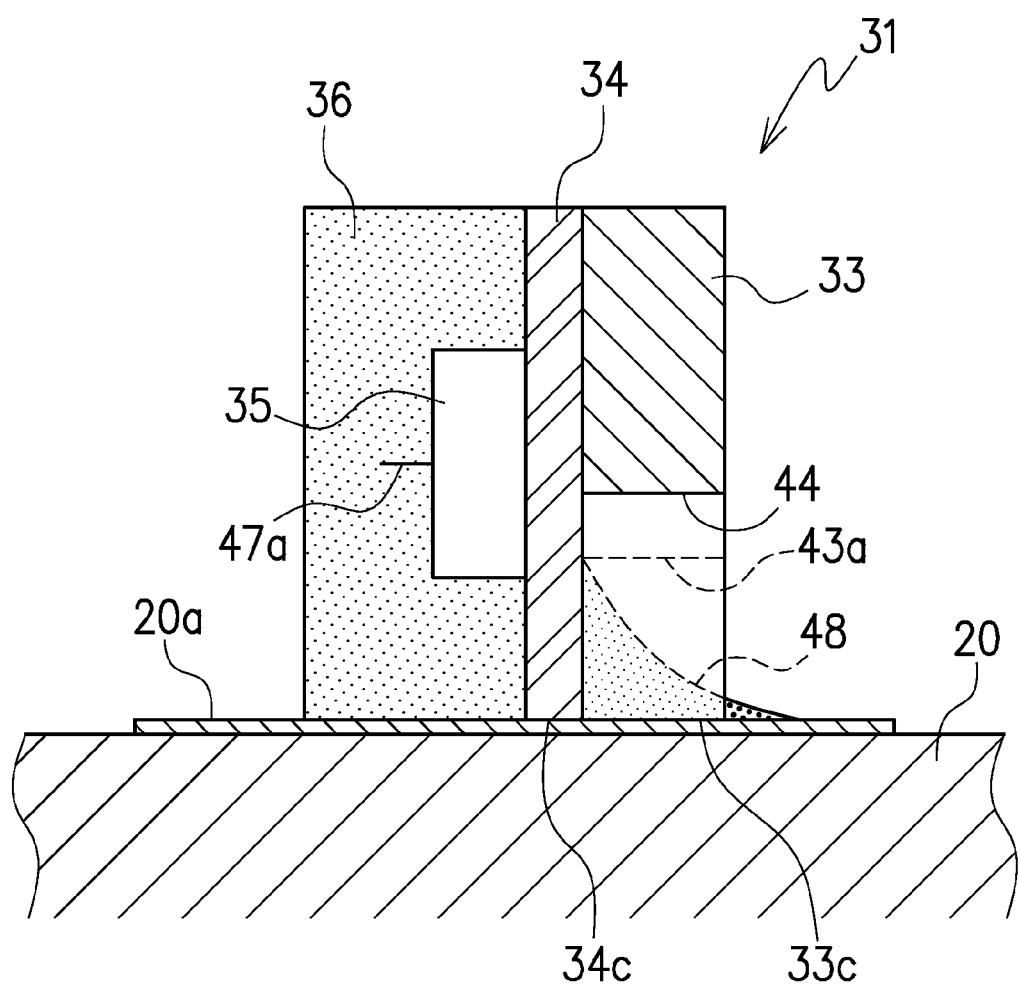
FIG. 7 is a sectional view taken along line VII-VII of the LED as shown in FIG. 6, which is mounted on a motherboard of an electric or electronic device such as a lighting device.
Figure 8A:
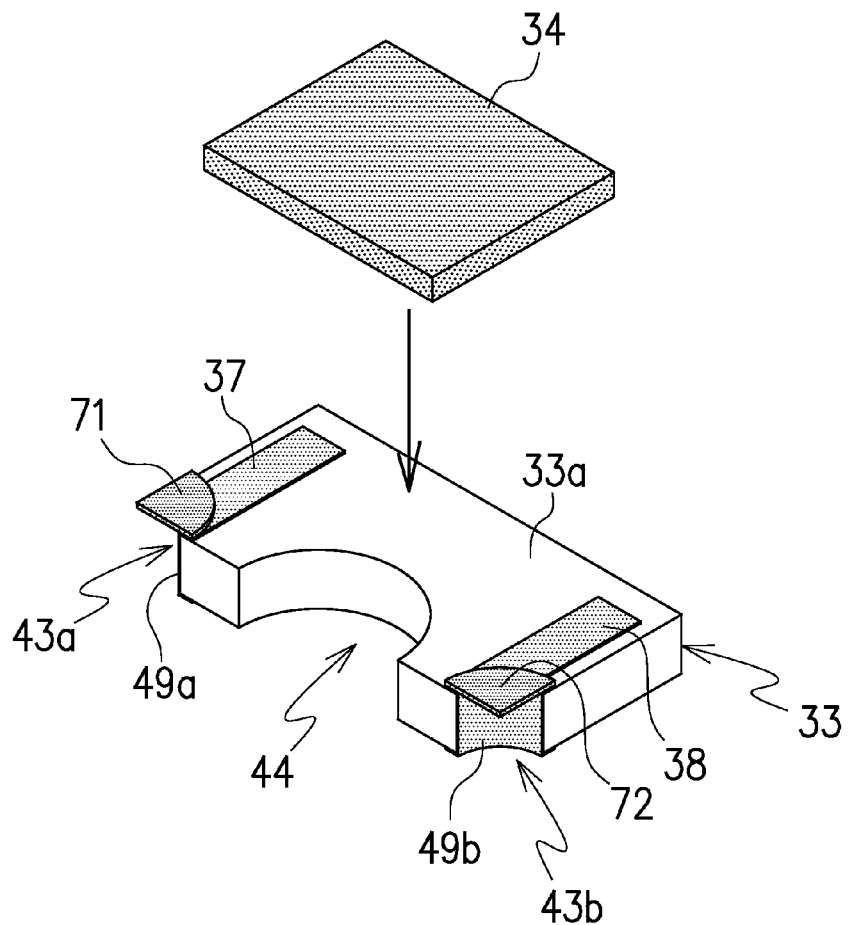
FIG. 8A is an exploded perspective view of the layered substrate according to the second embodiment of the present invention, showing that a second substrate is to be mounted on an upper surface of a first substrate, as viewed from above the second substrate.
Figure 8B:
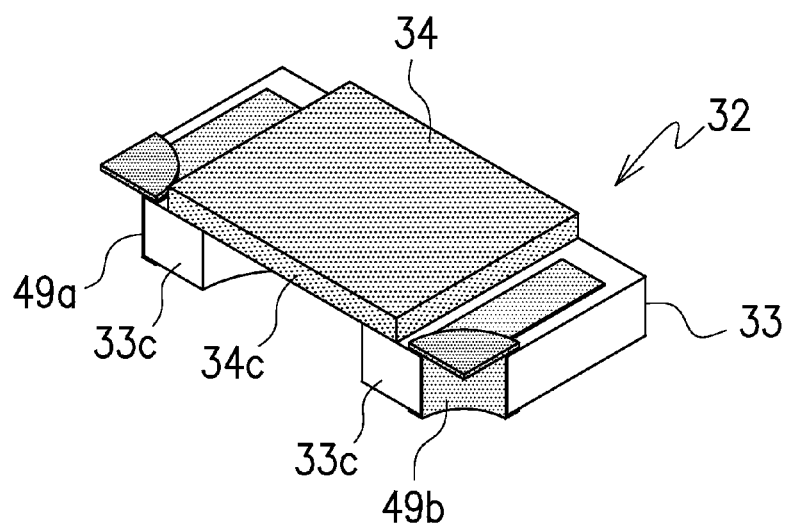
FIG. 8B is a perspective view of the layered substrate according to the second embodiment of the present invention, showing that the second substrate is mounted on the upper surface of the first substrate.
Figure 9A:
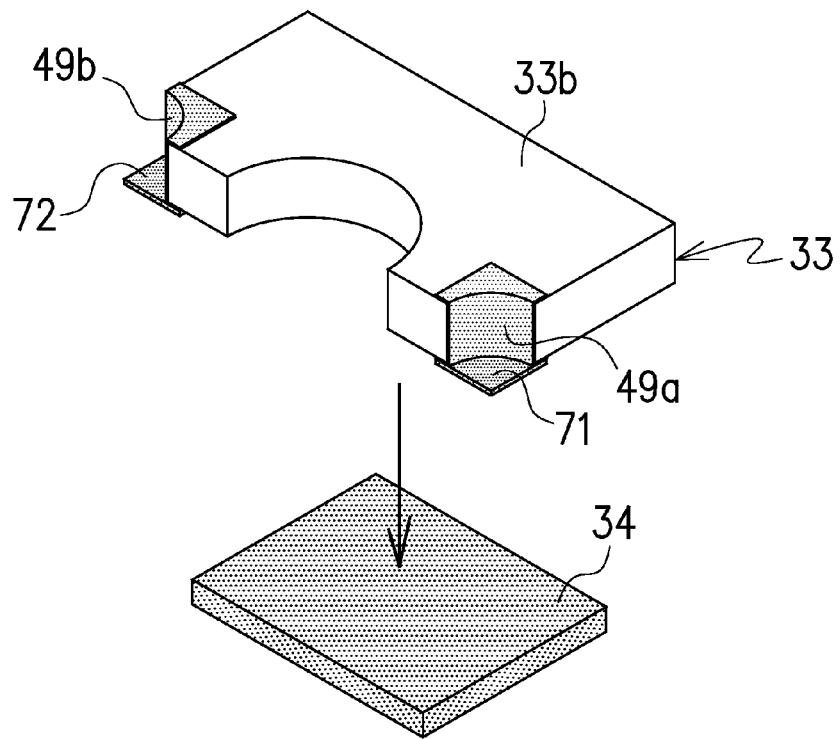
FIG. 9A is an exploded perspective view of the layered substrate according to the second embodiment of the present invention, showing that the second substrate is to be mounted on the upper surface of the first substrate, as viewed from below the first substrate.
Figure 9B:
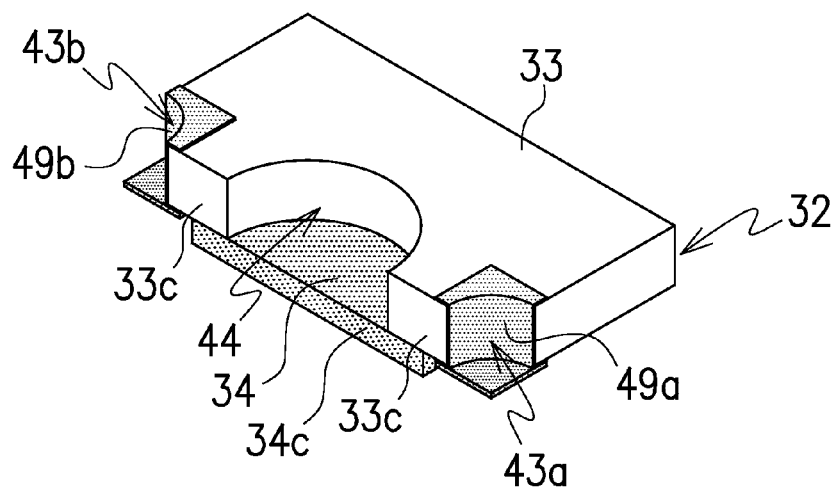
FIG. 9B is a perspective view of the layered substrate according to the second embodiment of the present invention, showing that the second substrate is mounted on the upper surface of the first substrate.

FIG. 7 shows a sectional view of an LED 31 including a layered substrate according to a second embodiment of the present invention and a light-emitting element mounted on the layered substrate. The one side surface of LED 31 is in contact with an upper surface of a motherboard of an electric or electronic device. At the one side surface 33c of the first substrate 33, the first cut portion 44 for thermal connection, the second cut portion 43a and the third cut portion 43b which are the pair of cut portions for electrical connection are positioned and the one side surface 33c is disposed on the motherboard 20. As shown in FIG. 7, when a solder being applied in each of the second cut portion 43a and the third cut portion 43b, the light-emitting element 35 is electrically connected to a circuit pattern 20a provided on the motherboard 20 through the solder, the first through-hole 40a, the second through-hole 49b, the first shielding plate 71, the second shielding plate 72, the first upper electrode 37 and second upper electrode 38.

In the second embodiment, because the second substrate 34 is formed by the metallic plate, the second substrate itself has excellent heat conductivity. Consequently, it is possible to efficiently release heat generated in the light-emitting element 35 into the first cut portion 44 of the first substrate 33. Also, heat can be released to the motherboard 20 by disposing the one side surface 34c of the second substrate 34 that includes the first to third cut portions on the circuit pattern 20a of the motherboard 20 to be in contact with the circuit board 20a.

Figure 10:
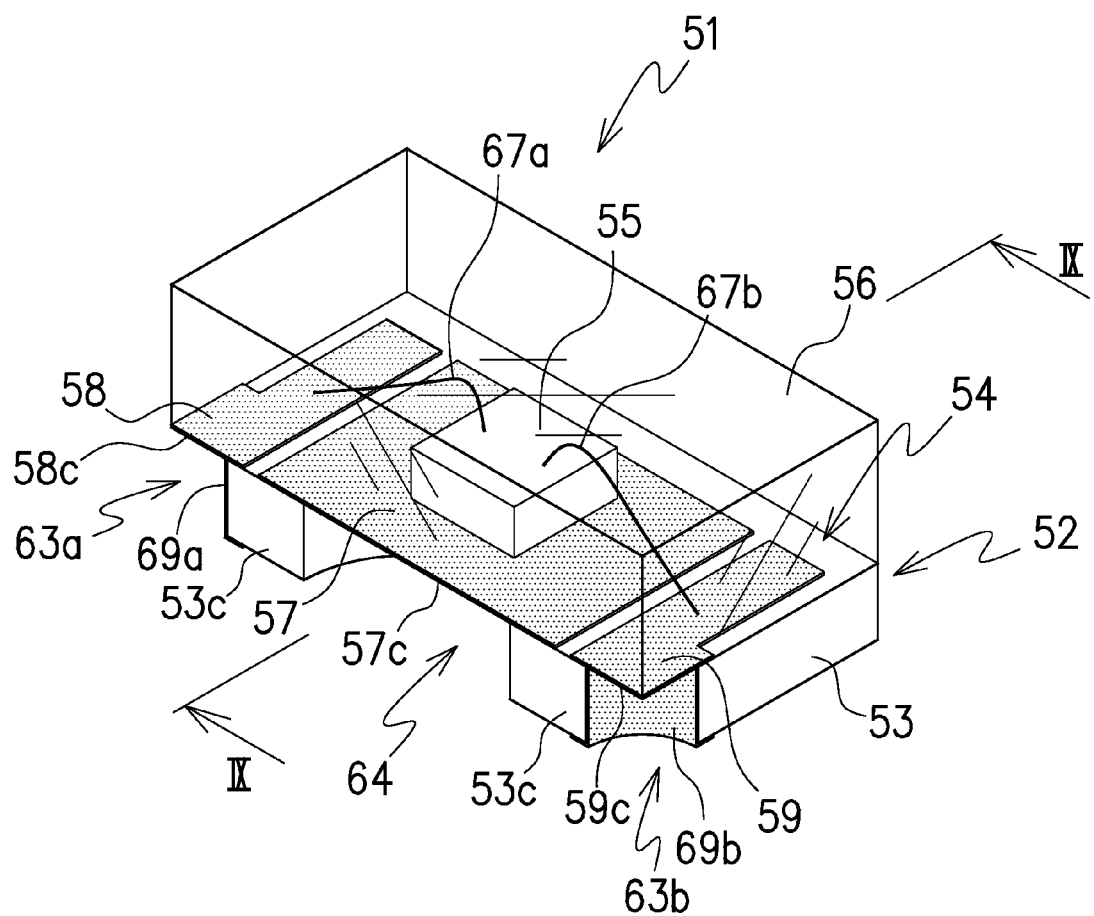
FIG. 10 is a perspective view of an LED including a layered substrate according to a third embodiment of the present invention and a light-emitting element mounted on the layered substrate.
Figure 11:
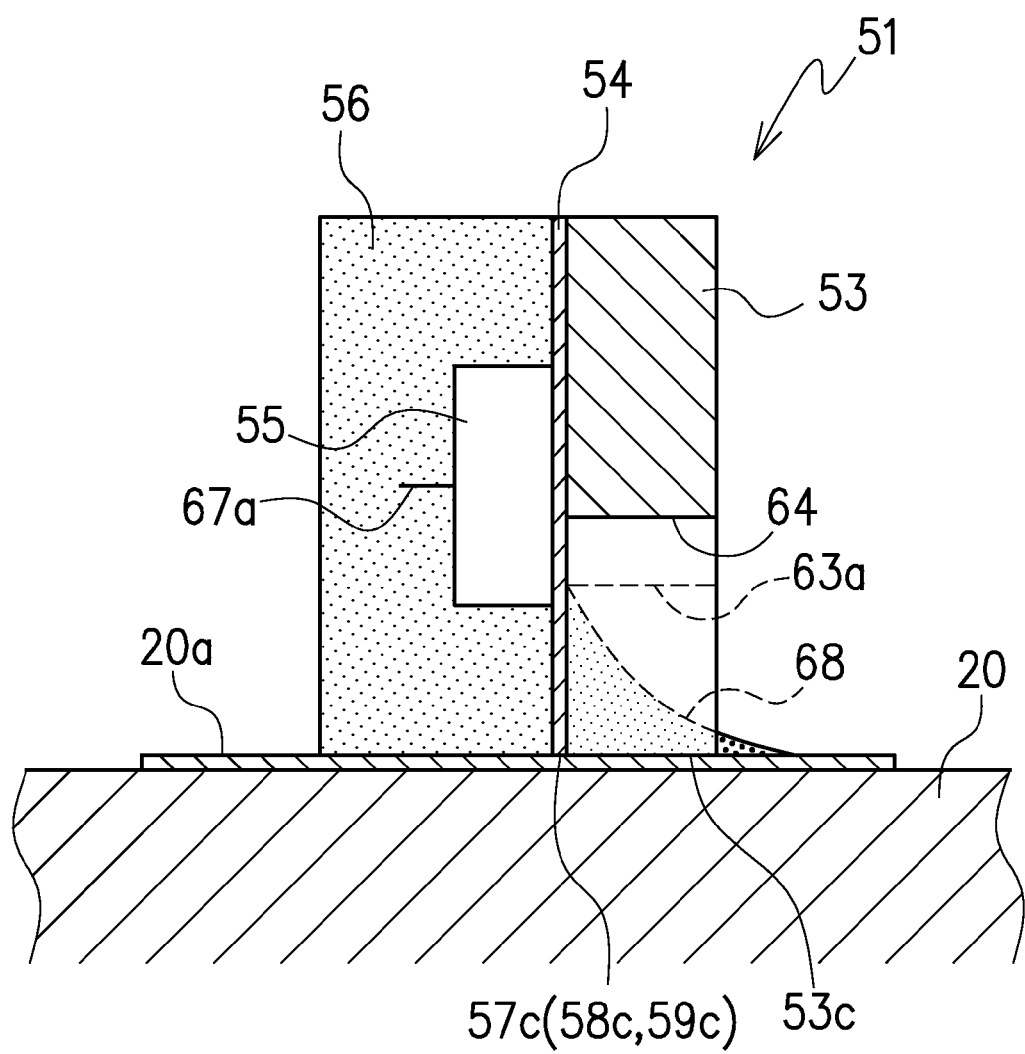
FIG. 11 is a sectional view taken along line IX-IX of the LED as shown in FIG. 10 and mounted on a motherboard of an electric or electronic device such as a lighting device.
Figure 12:
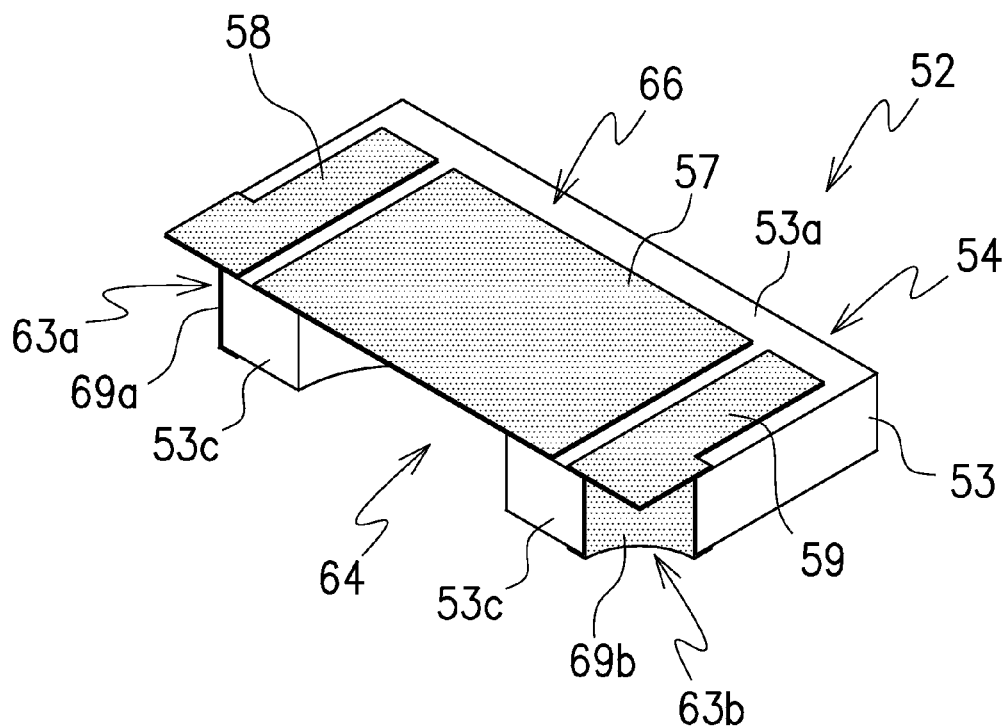
FIG. 12 is a perspective view of the layered substrate according to the third embodiment of the present invention as shown in FIG. 10, showing that a second substrate is mounted on an upper surface of a first substrate, as viewed from above the second substrate.
Figure 13:
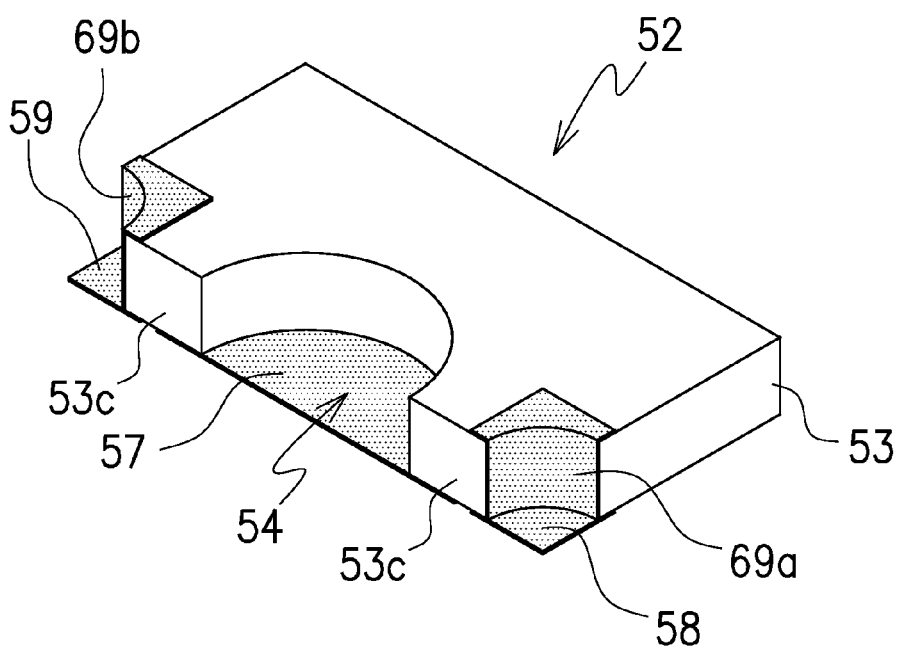
FIG. 13 is a perspective view of the layered substrate according to the third embodiment of the present invention in which the second substrate is mounted on the upper surface of the first substrate, as viewed from below the first substrate.

FIG. 10 is a perspective view of an LED including a layered substrate 52 according to a third embodiment of the present invention and a light-emitting element 55 is mounted on the layered substrate 52. FIG. 11 shows a sectional view taken along line IX-IX of the LED as shown in FIG. 10 and mounted on a motherboard of electric or electronic device such as a lighting device. FIG. 12 shows a perspective view of the layered substrate 52 according to the third embodiment of the present invention, showing that a second substrate 54 is mounted on an upper surface 53a of a first substrate 53, as viewed from above the second substrate 54.

As shown in FIG. 10, the LED 51 includes the layered substrate 52 including a first substrate 53 and a second substrate 54 including a plurality of strips 58, 57, and 59 adhered to an upper surface 53a of the first substrate 53, and a light-emitting element 55 mounted on one of the plurality of strips 58, 57, and 59 of the second substrate 54. In the third embodiment, the first substrate 53 is made of a resin similar to the first substrate in the first embodiment, and the second substrate 54 includes a first strip 58, a second strip 59, and a third strip 57. The third strip 57 is a shape of sheet larger than the first strip 58 and/or a second strip 59.

The first substrate 53 includes at a central portion of one side of the first substrate 53 a first semi-circular shaped cut portion 64 and a second cut portion 63a and a third cut portion 63b which are provided in opposite corners of one side surface of the first substrate 53 and smaller than the first cut portion 64 in size, similarly to the first embodiment.

The third strip 57 is disposed on a central portion of the first substrate 53. The first strip 58 is to be a first upper electrode and the second strip 59 is to be a second upper electrode of the second substrate 54. A first through-hole 69a is provided in the second cut portion 63a and configured to electrically connect the first upper electrode 58 provided on an upper surface 53a of the first substrate 53 and a lower surface 53b, and a second through-hole 69b is provided in the second cut portion 63b and configured to electrically connect the second strip 59 that is to be a second upper electrode 59 provided on the upper surface 53a of the first substrate 53 and the lower surface 53b.

The sheet-shaped second substrate 54 that includes the first strip, 58, the second strip 59 and the third strip 57 adhered on the upper surface 53a of the first substrate 53 is formed by, for example, a electric-conductive flexible substrate. The third strip 57 is disposed to cover the first cut portion 64 provided at a central portion of the upper surface of the first substrate 53, the first strip 58 is disposed to cover the second cut portion 63a which has a ¼ circular shape, and the second strip 59 is disposed to cover the third cut portion 63b has a ¼ circular shape. The first strip 58 and the second strip 59 are disposed on both sides of the third strip 57. The third strip 57, the first strip 58 and the second strip 59 may be separated, and the light-emitting element 55 is mounted on the third strip 57.

The light-emitting element 55 includes at an upper surface a pair of element electrodes as a first element electrode and a second element electrode. The first element electrode is electrically connected to the first strip 58 through a metallic wire 67a, and the second element electrode is electrically connected to the second strip 59 through a metallic wire 67b. The first strip 58 is electrically connected to the first through-hole 69a provided in the second cut portion 63a, and the second strip 59 is electrically connected to the second through-hole 69b provided in the third cut portion 63b. At this time, because the first strip 58 covers the second cut portion 63a and the second strip 59 covers the third cut portion 63b from above, when a light-transmitting resin 56 is provided on the first substrate 53, it is prevented that a part of the resin enters the second and/or third cut portions 63a and 63b. Consequently, in the third embodiment, the shielding members 71 and 72 in the second embodiment are not required.

In the LED 51 in the third embodiment, the second cut portion 63a and the third cut portion 63b as the pair of cut portions for electrical connection are provided and the first cut portion 64 for heat releasing is provided. By positioning downward the one side surface 53c of the first substrate 53 and disposing it on the motherboard 20, the lower electrodes exposed from the second cut portion 63a and the third cut portion 63b for electrical connection and the circuit pattern 20a of the motherboard 20 are electrically connected by the solder 68. Consequently, the light-emitting element 55 is electrically connected through the first through-hole 69a, the second through-hole 69b, the first strip 58 and the second strip 59 to the lower electrodes. That is to say, the first strip 58 and the second strip 59 are electrical-conductive sheets. Because the first strip 58 and the second strip 59 have electrical conductivity, they have high heat release effect. Accordingly, as a sheet of the first and second strips, a same material sheet may be used as that of the third strip 57.

In the third embodiment, because the second substrate 54 is formed by a plurality of electrical conductive sheets, and therefore, the second substrate itself can be a heat conductor, it is possible to efficiently release heat generated in the light-emitting element 55 mounted on the third strip 57 of the second substrate.

When mounting the LED 51 on the motherboard 20 in an electric or electronic device such as a lighting device and so on, because one side edge 57c of the third strip 57, one side edge 58c of the first strip 58, one side edge 59c of the second strip 59 are electrically connected to the circuit pattern 20a of the motherboard 20, heat release from the first strip 58, the second strip 59 and the third strip 57 to the motherboard 20 can be efficiently accomplished. The third strip 57, the first strip 58 and the second strip 59 may be formed by a metallic sheet. Alternatively, each of the third strip 57, the first strip 58 and the second strip 59 may be formed by a sheet plate comprising a flexible substrate having a pathway of electrical conductivity and/or heat conductivity upward and downward.

As mentioned above, the LED according to the aforementioned embodiments includes a first cut portion having cut portions for heat release, a second substrate which has a thickness thinner than that of the first substrate and on which a light-emitting element is mounted, and has high heat release effect. Consequently, it is possible to acquire high heat-release property when mounting the LED on a motherboard in such an illumination device and so on even without providing another heat-release member. It is possible for the second substrate to use selectively a mounting substrate depending on an intended use, such as a resin substrate, a metallic substrate having high heat conductivity or a flexible substrate having a sheet-like electrode surface, a plurality of strips and so on. Meanwhile, in the aforementioned embodiments, although such a layered substrate according to embodiments of the present invention of course can be used in an LED which is to be mounted on a motherboard with one side of the LED in contact with the motherboard, as such a layered substrate includes a structure of heat-releasing effect, it is possible to apply the layered substrate according to embodiments of the present invention to devices with an element that generates heat.

Although the preferred embodiments of the present invention have been described, it should be understood that the present invention is not limited to these embodiments, various changes and modifications can be made to the embodiments by those skilled in the art as long as such modifications and changes are within the scope of the present invention as defined by the claims.

What is claimed is:

1. A layered substrate comprising:
a first substrate including an upper surface, a lower surface, a peripheral surface between peripheral edges of the upper surface and the lower surface, and a cut portion cut into the peripheral surface and passing through the upper surface and the lower surface;
a second substrate including an upper surface, a lower surface, and a peripheral surface between peripheral edges of the upper surface and the lower surface, and the lower surface of the second substrate being layered on the upper surface of the first substrate; and
the second substrate including a heat conductor that is capable of being thermally connected to an element to be mounted on the upper surface of the second substrate, the heat conductor including a metal plate that closes the cut portion of the first substrate and is configured to thermally extend to the cut portion of the first substrate.

2. A light-emitting diode comprising:
the layered substrate of claim 1; and
the element mounted on the upper surface of the second substrate, the element being a light-emitting element.

3. A layered substrate comprising:
a first substrate including an upper surface, a lower surface, a peripheral surface between peripheral edges of the upper surface and the lower surface, and a cut portion cut into the peripheral surface and passing through the upper surface and the lower surface: and
a second substrate including an upper surface, a lower surface, and a peripheral surface between peripheral edges of the upper surface and the lower surface, and the lower surface of the second substrate being layered on the upper surface of the first substrate and closing the cut portion of the first substrate from above.
wherein the second substrate includes a heat conductor that can be thermally connected to an element to he mounted on the upper surface of the second substrate, the heat conductor being configured to thermally extend to the cut portion of the first substrate, and the second substrate further includede an upper electrode on the upper surface of the second substrate and a lower electrode on the lower surface of the second substrate, and
wherein the lower electrode of the second substrate overlaps with the cut portion of the first substrate in a plan view.

4. The layered substrate according to claim 3 wherein the heat conductor that is provided in the second substrate passing through the second substrate from the upper surface to the lower surface of the second substrate.

5. The layered substrate according to claim 3 wherein:
the second substrate includes a pair of upper electrodes as the first upper electrode and a second upper electrode with a space between the first upper electrode and the second upper electrode on the upper surface of the second substrate,
a pair of lower electrodes as the first lower electrode and a second lower electrode with a space between the first lower electrode and the second lower electrode on the lower surface of the second substrate,
the heat conductor that including a pair of heat conductors as a first heat conductor and a second heat conductor,
the first upper electrode being electrically connected to the first lower electrode through the first heat conductor, and
the second upper electrode being electrically connected to the second lower electrode through the second heat conductor.

6. The layered substrate according to claim 5:
wherein the first heat conductor and the second heat conductor are made of metal and the first heat conductor is greater than the second heat conductor in volume.

7. The layered substrate according to claim 3:
the heat conductor being a metal filled in a hole provided in the second substrate.

8. A light-emitting diode comprising:
a first substrate including an upper surface, a lower surface, a peripheral surface between peripheral edges of the upper surface and the lower surface, and a eut portion cut into the peripheral surface and passing; through the upper surface and the lower surface:
a second substrate including an upper surface, a lower surface, and a peripheral surface between peripheral edges of the upper surface and the lower surface, and the lower surface of the second substrate being layered on the upper surface of the first substrate; and
a light-emitting element mounted on the upper surface of the second substrate.
the second substrate including a heat conductor that is a metal plate closing the cut portion of the first substrate from above, thermally connected to the light-emitting element mounted on the upper surface of the second substrate, and configured to thermally extend to the cut portion of the first subtrate.

9. The layered substrate according to claim 1:
wherein the first substrate is greater than the second substrate in thickness.

10. The layered substrate according to claim 1:
wherein the second substrate is a flexible substrate. that closes the cut portion of the first substrate.

11. The layered substrate according to claim 1:
wherein the cut portion is a concave cut portion.

12. The light-emitting diode according to claim 2 wherein:
the light-emitting element is mounted on the upper surface of the second substrate and positioned above the cut portion of the first substrate.

13. A layered substrate comprising:
a first substrate including an upper surface, a lower surface, a peripheral surface between peripheral edges of the upper surface and the lower surface, and a cut portion cut into the peripheral surface and passing through the upper surface and the lower surface;
a second substrate including an upper surface, a lower surface, and a peripheral surface between peripheral edges of the upper surface and the lower surface, and the lower surface of the second substrate being layered on the upper surface of the first substrate; and
the second substrate including a hsat conductor that can be thermally connected to an element to be mounted on the upper surface orthe second substrate, and the heat conductor is configured to thermally extend to the cut portion of the first substrate.

the cut portion being a first cut portion, and the first substrate including a second cut portion smaller than the first cut portion in size and a third cut portion smaller than the first cut portion in size, and the second cut portion and the third cut portion being provided at corners of the first substrate with the first cut portion centered between the second cut portion and the third cut portion.

14. The layered substrate according to claim 13:

the second cut portion cut into a first corner of the corners and passing through the upper surface to the lower surface of the first substrate; and the third cut portion cut into a second corner of the corners and passing through the upper surface to the lower surface of the first substrate.

15. The layered substrate according to claim 14:

the second cut portion including a first through-hole electrode electrically connected to the first lower electrode of the second substrate; and the third cut portion including a through-hole electrode electrically connected to the second lower electrode of the second substrate.

16. The layered substrate according to claim 15:

the second substrate including a first strip that is disposed on the upper surface of the first substrate and includes an electrical conductor disposed in a direction from the upper surface of the first strip to the lower surface of the first strip and electrically connected to the first through-hole electrode at the second cut portion; and the second substrate including a second strip that is disposed on the upper surface of the first substrate and includes an electrical conductor disposed in a direction from the upper surface of the second strip to the lower surface of the second strip and electrically connected to the second through-hole electrode at the third cut portion.

17. A lighting device comprising:

a light-emitting diode including the layered substrate of claim 14, and a light-emitting element mounted on the upper surface of the second substrate of the layered substrate; and a motherboard including an upper surface, a lower surface, a peripheral surface between peripheral edges of the upper surface and the lower surface, and a wiring pattern disposed on the upper surface of the motherboard; the light-emitting diode disposed on the upper surface of the motherboard with the second cut portion and the third cut portion of the first substrate of the layered substrate disposed adjacent to the wiring pattern of the motherboard.

18. The layered substrate according to claim 13, wherein the heat conductor is an electrode.

19. The layered substrate according to claim 13, wherein the heat conductor includes a metal member.

* * * * *